United States Patent [19]
Berry et al.

[11] Patent Number: 5,459,013
[45] Date of Patent: Oct. 17, 1995

[54] IMAGE REVERSAL METHOD FOR REPAIRING DEFECTIVE AREAS ON MICROELECTRONIC SUBSTRATES

[75] Inventors: Michele J. Berry, Durham; Paul A. Magill, Chapel Hill, both of N.C.

[73] Assignee: MCNC, Research Triangle Park, N.C.

[21] Appl. No.: 234,233

[22] Filed: Apr. 28, 1994

[51] Int. Cl.[6] .................................................. G03C 5/00
[52] U.S. Cl. .......................... 430/315; 430/311; 430/324; 430/329; 250/492.3
[58] Field of Search ............................ 430/30, 311, 315, 430/324, 329; 356/237; 250/492.3

[56] References Cited

U.S. PATENT DOCUMENTS

| | | | |
|---|---|---|---|
| 4,751,169 | 6/1988 | Behringer | 430/296 |
| 5,145,714 | 9/1992 | Reisman et al. | 427/53.1 |
| 5,182,230 | 1/1993 | Donelon et al. | 437/173 |

OTHER PUBLICATIONS

*Silicon Processing For The VLSI Era, vol. 1: Process Technology*, Wolf et al., Lattice Press, 1986, pp. 421–423.
*Image Reversal: A Practical Approach to Lift–Off*, Jones et al., SPIE vol. 771 Advances in Resist Technology and Processing IV (1987), pp. 231–241.
*Process Factors in Ammonia Catalyzed Image Reversal*, Semiconductor International, May 1988, pp. 200–204.
*Image Reversal and Lift–Off: A Versatile Combination for ULSI Processing*, Jones et al., Proc. Eighth International Tech. Conference on Photopolymer, Oct. 1988 (SPE).

Primary Examiner—Kathleen Duda
Attorney, Agent, or Firm—Bell, Seltzer, Park & Gibson

[57] ABSTRACT

A defective area on a microelectronic substrate is repaired using an image reversal photoresist and image reversal process. The defective area on a microelectronic substrate is identified and a layer of image reversal photoresist is applied to the microelectronic substrate. The image reversal photoresist is then exposed twice in an image reversal process, and the image reversal photoresist is then removed over the defective area. A repair material is then blanket deposited, and the image reversal photoresist is removed in a lift-off operation such that the material on the defective area remains. Missing lines and broken lines may be repaired. Conductive and dielectric materials may be repaired.

21 Claims, 4 Drawing Sheets

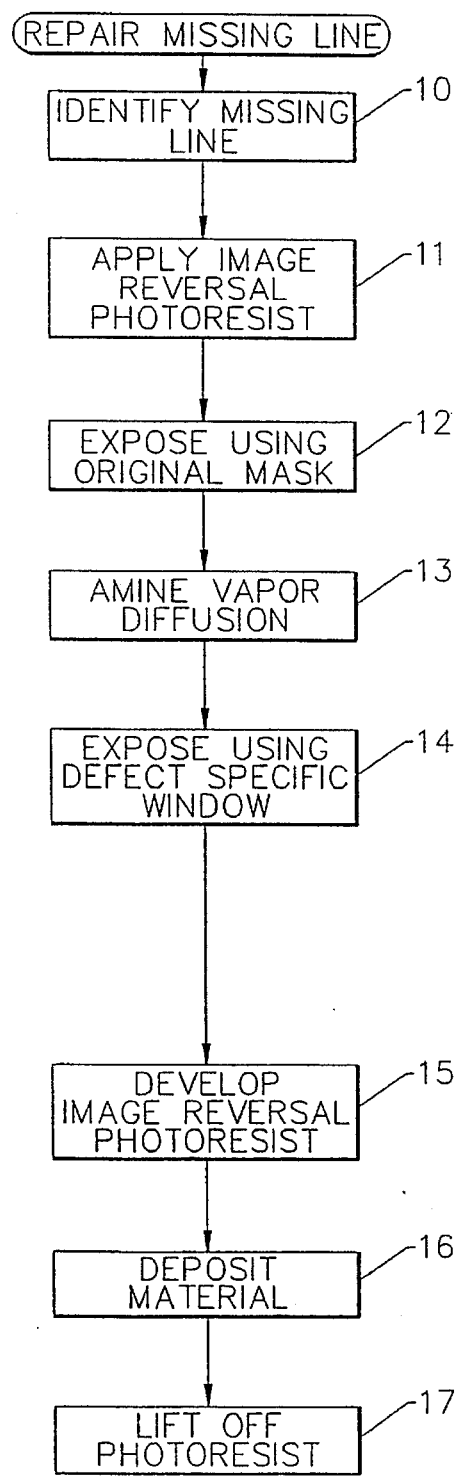
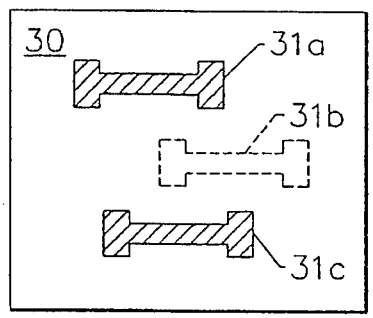
FIG. 3A.
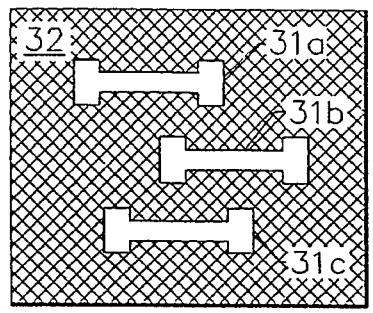
FIG. 3B.
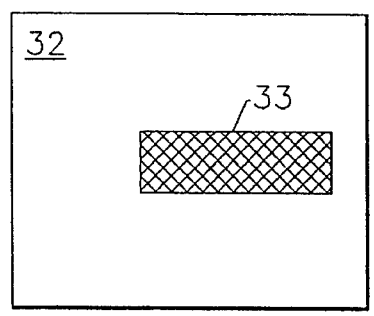
FIG. 3C.
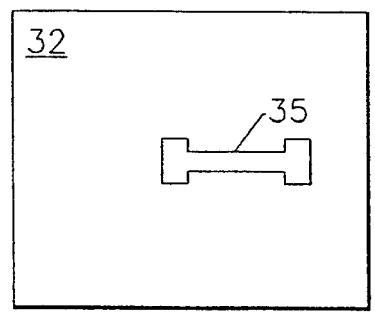
FIG. 3D.
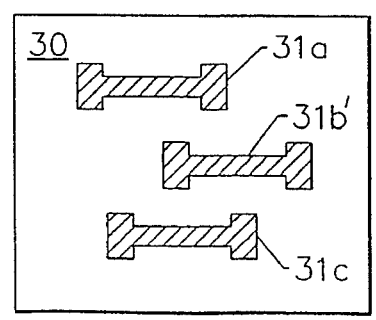
FIG. 3E.

IMAGE REVERSAL METHOD FOR REPAIRING DEFECTIVE AREAS ON MICROELECTRONIC SUBSTRATES

FIELD OF THE INVENTION

This invention relates to microelectronic substrate manufacturing methods and more particularly to microelectronic substrate repairing methods.

BACKGROUND OF THE INVENTION

Microelectronic substrates, such as semiconductor integrated circuit chips, multichip modules, printed circuit boards and multilayer ceramic substrates, are widely used in electronic systems. As the state of the art for manufacturing microelectronic substrates continues to advance, higher density and higher functionality substrates are being made. Since a single defect can produce an unusable microelectronic substrate, it is desirable to repair a defective area on a microelectronic substrate.

Known microelectronic substrate repair methods typically require local heating of a defective area on a microelectronic substrate. For example, U.S. Pat. No. 5,182,230 to Donelon et al. entitled *Laser Methods for Circuit Repair on Integrated Circuits and Substrates* uses a laser plating technique to repair conducting metal lines. U.S. Pat. No. 5,145,714 to Reisman et al. entitled *Metal-Organic Chemical Vapor Deposition for Repairing Broken Lines in Microelectronic Packages* describes a method for repairing broken lines using chemical vapor deposition under localized heating. Unfortunately, localized heating can vary widely depending on the materials used, the topography of the microelectronic substrate and the design density. Accordingly, the topography of a material that is deposited for repair tends to be nonuniform.

SUMMARY OF THE INVENTION

It is therefore an object of the invention to provide methods for repairing a defective area on a microelectronic substrate.

It is another object of the present invention to provide methods for uniformly depositing a material on a microelectronic substrate for repair of a defective area.

It is still another object of the present invention to provide methods for repairing a defective area of microelectronic substrates without requiring localized heating.

These and other objects are provided, according to the present invention, by using an image reversal photoresist and an image reversal exposure process to produce a lift-off stencil for use in repairing a defective area on a microelectronic substrate. As is known to those having skill in the art, an image reversal photoresist is a photoresist which allows the tone of the image in positive resist to be reversed so that it functions as a negative resist. In a positive resist, exposed (irradiated) regions are soluble so that a positive image of the mask is produced in the resist. In a negative resist, the unexposed regions are dissolved by a developer so that a negative image of the mask is produced.

In particular, according to the invention, a defective area on a microelectronic substrate is repaired by identifying the defective area on the microelectronic substrate, applying an image reversal photoresist on the microelectronic substrate, and twice exposing the image reversal photoresist for image reversal. The tone of the image reversal photoresist is reversed, for example from positive to negative, between the two exposure steps. The image reversal photoresist is then developed to remove the photoresist from over the defective area. A repair material is blanket deposited on the remaining image reversal photoresist and on the defective area. The image reversal photoresist is thereafter removed and the material thereon is thereby lifted off, with the material on the defective area remaining. The twice exposing step preferably includes the steps of exposing a frame in the image reversal photoresist which surrounds the defective area, and exposing a window in the image reversal photoresist which overlies the defective area and overlaps the frame. Tone reversal is performed between the two exposing steps.

The present invention can be used to repair at least two types of defective areas on a microelectronic substrate. The first defective area is a missing line in a plurality of conductive or dielectric lines on the microelectronic substrate, also referred to as "missing line repair". The second defective area is a missing portion of a conductive or dielectric line or area, also referred to as "broken line repair". In general, in missing line repair, the original mask or mask data which was used to expose all of the lines can be used in the image reversal process. In broken line repair, a defect specific exposure is provided. However, since the defect specific exposure only requires a frame and window surrounding the missing area, high speed repair may be accomplished.

A missing line repair method according to the present invention first exposes the image reversal photoresist using the original mask which was used to image the plurality of lines including the missing line. All of the image reversal photoresist is exposed except for the portions thereof which define the lines including the missing line, thereby forming a frame around the missing line. The tone of the photoresist is then reversed. A second exposure exposes a window in the image reversal photoresist which overlies the missing line, but not the other lines. The image reversal photoresist is then developed to remove the photoresist from over the missing line, and thereby form a lift-off stencil for the missing line. An appropriate conductor or dielectric is then blanket deposited and lifted off to repair the missing line.

A broken line repair method first exposes a frame in the image reversal photoresist, which frame surrounds the missing portion. The frame need not be very wide, so it can be exposed quickly using an electron beam or other direct write system, thereby increasing throughput. Customized masks need not be generated. The tone of the photoresist is then reversed. The second exposure exposes a window in the image reversal photoresist, which overlies the missing portion and also overlaps at least part of the frame. Development, material deposition and lift-off are then performed as described above.

An image reversal method which is used to repair a defective area on the microelectronic substrate according to the present invention, preferably uses an image reversal photoresist which includes an organic carboxylic acid. In such a method, an amine vapor diffusion is performed between the two exposure steps in order to reverse the tone of the photoresist from positive to negative. When an image reversal photoresist is used, the photoresist which remains after two exposures and development produces a wall around the defective area which makes an acute angle with the defective area. Stated differently, the photoresist wall makes an obtuse angled wall with the remaining photoresist. The obtuse angled wall is particularly suitable for lift-off processing. Other image reversal resists and image reversal processes may also be used.

BRIEF DESCRIPTION OF THE DRAWINGS

FIG. 1 illustrates a method of repairing a missing line according to the present invention.

FIGS. 3A–3E illustrate top views of a microelectronic substrate during intermediate processing steps for the method of FIG. 1.

DETAILED DESCRIPTION OF PREFERRED EMBODIMENTS

Figure 2:
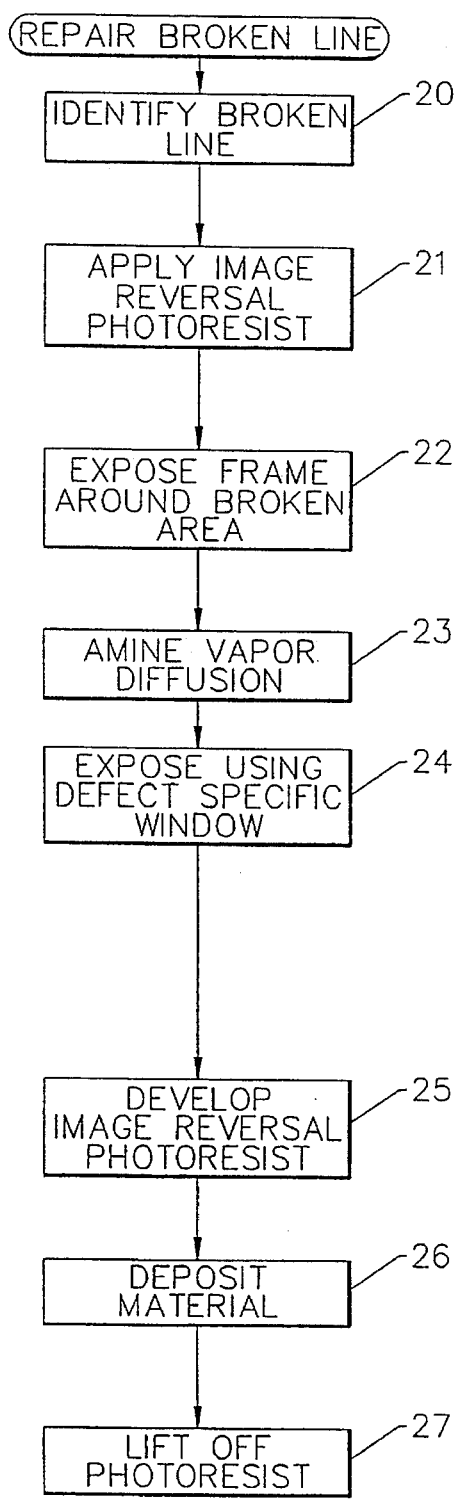
FIG. 2 illustrates a method of repairing a broken line according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIG. 1, a method for repairing a missing line according to the present invention is illustrated. As shown at Block 10, a missing line is identified using optical inspection, electrical testing, or other conventional techniques. Thus, for example, FIG. 3A illustrates a top view of a microelectronic substrate 30 including conductive lines 31a and 31c, wherein line 31b is missing.

Referring again to FIG. 1, at Block 11, an image reversal photoresist is applied to the microelectronic substrate 30, using deposition, spin coating or other conventional techniques. Image reversal photoresists and processes are described generally in *Silicon Processing For the VLSI Era* by Wolf et al., Lattice Press, 1986, Vol. 1, pp. 421–423, the disclosure of which is hereby incorporated herein by reference. One type of image reversal photoresist includes an organic carboxylic acid which undergoes catalytic, thermal decarboxylation upon exposure to bases, resulting in an indene that inhibits disillusion. Exposed regions of the resist undergo decarboxylation during vapor diffusion of an amine during processing, thereby reversing the tone of the photoresist. During subsequent UV flood exposure, previously unexposed regions containing naphthaquinone diazide sensitizer undergo standard photochemistry reactions to form a base-soluble photoproduct, indene carboxylic acid. Following development in an aqueous base, the initially unexposed regions are developed away while the initially patterned regions are retained, resulting in a reversed image.

The above described ammonia catalyzed image reversal processing is described in detail in publications entitled *Image Reversal: A Practice Approach to Lift-Off*, S. Jones et al., SPIE Vol. 771 (1987), pp. 231–241; *Process Factors in Ammonia Catalyzed Image Reversal*, D. Ziger et al., Semiconductor International, May 1988, pp. 200–204; and *Image Reversal and Lift-Off: A Versatile Combination For ULSI Processing*, S. Jones et al., Proceedings of the Eighth International Technical Conference on Photopolymers, October 1988, pp. 279–291. The disclosures of all of the aforementioned publications are hereby incorporated herein by reference. An image reversal process for via selection for customizing an Application Specific Integrated Circuit (ASIC) is described in application Ser. No. 08/046,529, now abandoned, by Kellam entitled *High Resolution Mask Programmable Via Selected by Low Resolution Photomasking*. Although the present invention will be described with respect to such an ammonia catalyzed image reversal process, other image reversal photoresists and processes may also be used.

Referring again to FIG. 1, a first exposure is performed at Block 12 using the original mask. Thus, the mask which was originally used to form the plurality of lines 31a, 31c including the missing line 31b, is again used for exposing the photoresist. FIG. 3B illustrates the image reversal photoresist layer 32 on microelectronic substrate 30. The exposed regions are illustrated by cross-hatching.

Referring again to FIG. 1 at Block 13, an amine vapor diffusion then takes place which removes the acid group from the photoresist to cause decarboxylation. Once removed, this acid group cannot form again. The tone of the photoresist is thereby reversed. At Block 14, a second exposure is performed using a defect specific window. FIG. 3C illustrates the defect specific window which is used for a second exposure of photoresist 32. As shown by cross-hatching, the defect specific window overlies the missing line 31b but does not overlie the existing lines 31a, 31c.

Referring again to FIG. 1, the image reversal photoresist is then developed at Block 15 using an aqueous base. As shown in FIG. 3D, after development, the image reversal photoresist 32 forms a lift-off stencil surrounding the area of the missing line 31b. It will be understood by those having skill in the art that the photoresist wall 35 makes an obtuse angle with the remaining photoresist. Stated differently, the wall 35 makes an acute angle with the missing line on the microelectronic substrate. This angle is desirable for lift-off processes.

Referring again to FIG. 1, a material which is used to repair the missing line is then deposited. If the missing line 31b is metal, an appropriate metal is blanket deposited. Combinations of metal may be deposited as may be other conductors such as polysilicon. If a dielectric is being repaired, an appropriate dielectric such as silicon dioxide or silicon nitride may be deposited. Then, as shown at Block 17, lift-off is performed by removing the photoresist 32, and the deposited material thereon, so that the deposited material on the missing line 31b forms a replacement line 31b' as shown in FIG. 3E.

Figure 5A:
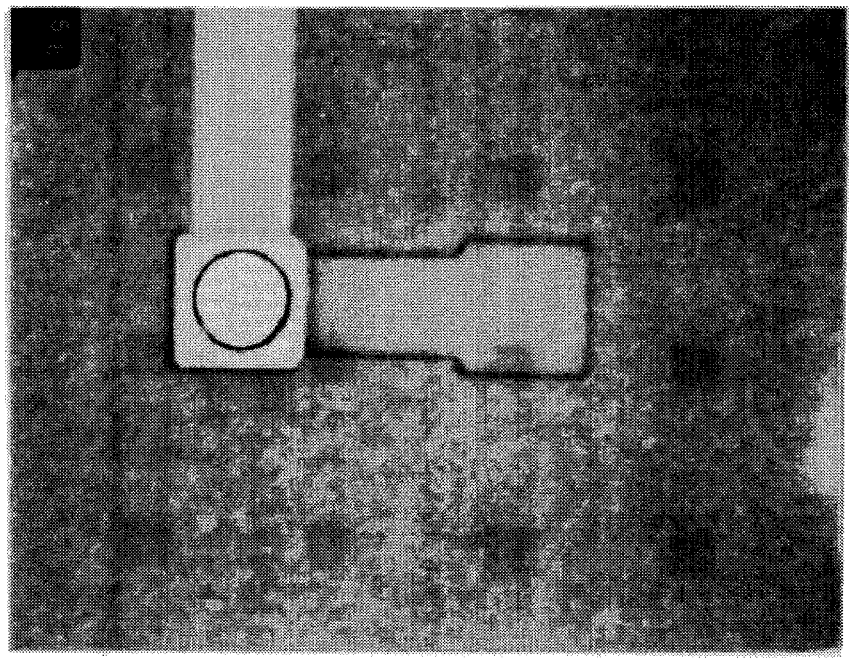
FIGS. 5A and 5B are photomicrographs illustrating a missing line defect and a repaired line, respectively.
Figure 5B:
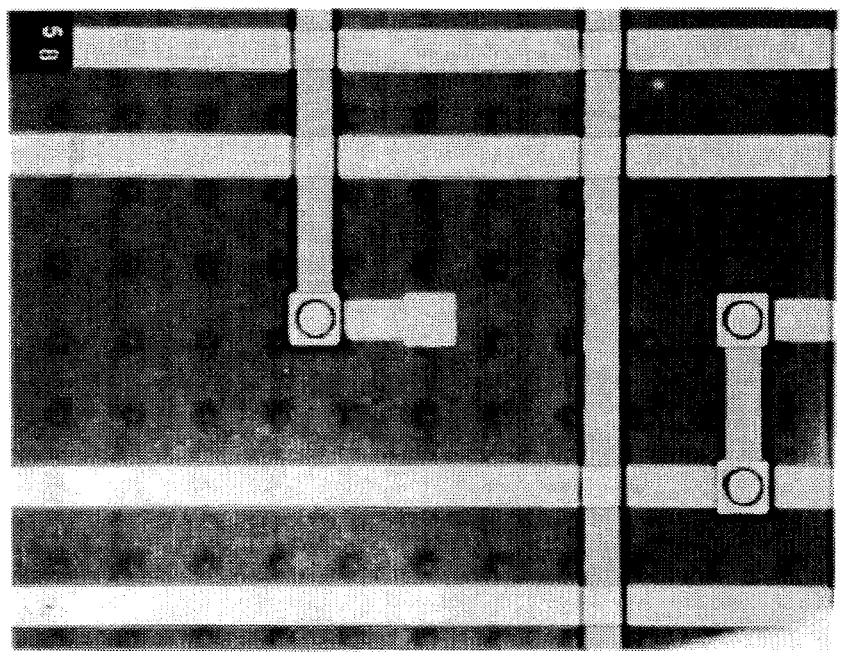

The method described above with respect to FIG. 1 is preferably used to repair an entire missing line. It does not require generation of new mask data, but rather utilizes the existing mask which was used to form the plurality of lines. Since a lift-off process is used, a repaired line of uniform topography is provided. FIGS. 5A and 5B illustrate photomicrographs of a missing line defect and a repaired line, corresponding to FIGS. 3A and 3E, respectively.

The method described in FIG. 1 may also be used to repair a broken line by overlying a repair line over the missing area of the line as well as the existing area of the line. However, this may cause an undesirable topographic change between the missing area and the existing line. Thus, the method described in FIG. 2 is preferably used to repair a broken line. It is also preferably used to repair any missing portion of a microelectronic substrate.

Figure 4A:
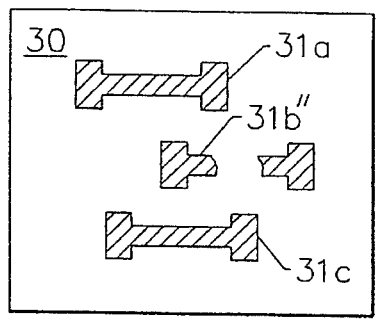
FIGS. 4A–4E illustrate top views of a microelectronic substrate during intermediate processing steps for the method of FIG. 2.
Figure 4B:
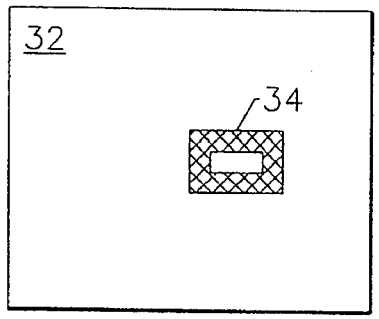

Referring now to FIG. 2, a method for repairing a broken line begins with an identification of a broken line 20 as was already described with respect to Block 10 of FIG. 1. FIG. 4A illustrates a microelectronic substrate 30 having two lines 31a, 31c and a broken line 31b". Referring again to FIG. 2, image reversal photoresist is applied at Block 21 as was already described with respect to Block 11 of FIG. 1. Then, referring to Block 22 and FIG. 4B, a frame 34 is exposed surrounding the missing portion of line 31b". The unexposed area within the frame 34 is preferably coextensive with the missing portion in line 31b" (i.e. the inner wall of frame 34 borders the missing portion), and the frame 34 is preferably sufficiently thick to allow a subsequent exposure within frame 34.

Figure 4C:
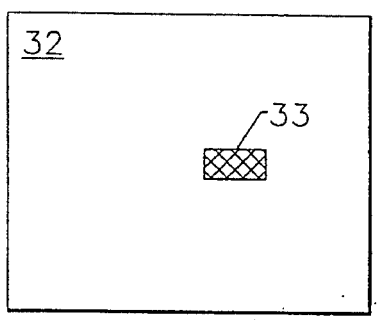

Referring again to FIG. 2, an amine vapor deposition is performed at Block 23 as was already described with respect to Block 13 of FIG. 1. Then, at Block 24, a second exposure is performed using a defect specific window. The window, illustrated in FIG. 4C at 33, overlies the missing portion of line 31b" and also overlaps the frame 34. The window 33 is sized such that it exposes the area where the material is to be deposited but does not extend into the resist region beyond where the area of frame 34 of FIG. 4B. Thus, only the area where the material is to be deposited will be developed to form the lift-off stencil.

It will be understood by those having skill in the art that frame 34 and window 33 may be exposed by generating customized masks. However, preferably they are exposed using electron beam or other direct writing exposure tools. In direct writing, the throughput time is related to the area which must be exposed or written. Since frame 34 and window 33 both constitute very small areas, they may be written or exposed using direct writing tools without adversely impacting throughput.

Figure 4D:
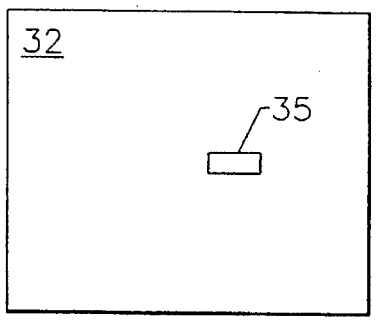
Figure 4E:
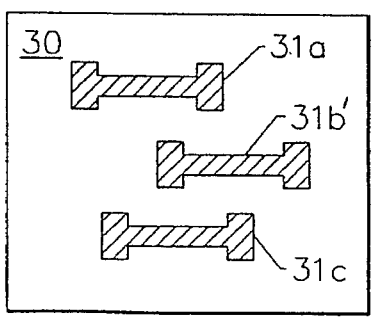
Figure 6A:
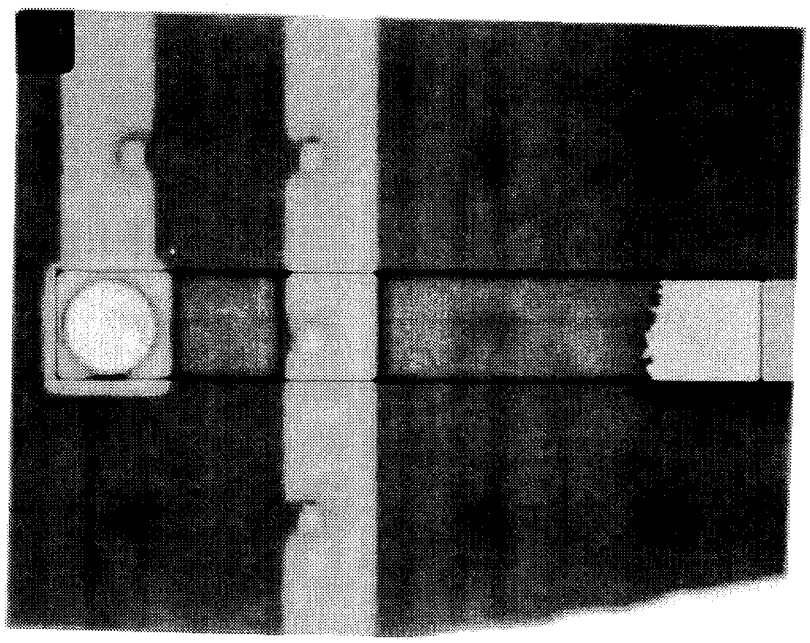
FIGS. 6A and 6B are photomicrographs illustrating a broken line defect and a repaired line, respectively.
Figure 6B:
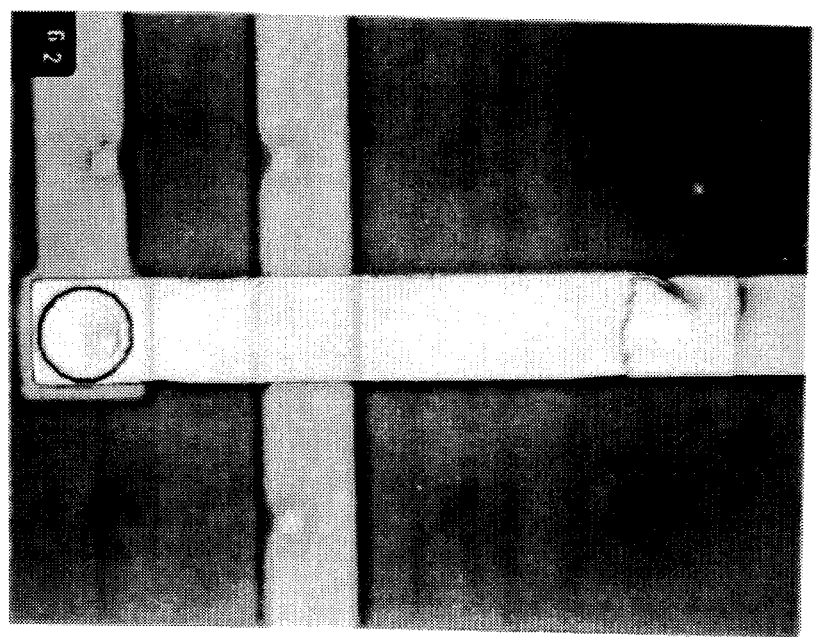

Referring again to FIG. 2, the image reversal photoresist is developed at Block 25 as was already described at Block 15 of FIG. 1. FIG. 4D illustrates the developed photoresist including the angled wall 35. Finally, referring again to FIG. 2, a material is deposited at Block 26, as was already described with respect to Block 16 of FIG. 1 and the photoresist is lifted off at Block 27 as was already described with respect to Block 17 of FIG. 1. FIG. 4E illustrates the microelectronic substrate 30 including the repaired broken line 31b". FIGS. 6A and 6B illustrates photomicrographs of a broken line and a repaired line, corresponding to FIGS. 4A and 4E respectively.

It will also be understood by those having skill in the art that the method described with respect to FIG. 2 can also be used to repair a missing line. However, if the original mask data for missing lines is already available, it is generally more efficient to use this original mask data as was described in FIG. 1.

Since the repair methods according to the present invention use photolithographic pattern generation, the results are well controlled. The combination of a photolithographic pattern generation and a lift-off process produces a repair with well-defined edges as well as an obtuse angle lift-off sidewall slope. Thus, practice of a method according to the present invention can be visually identified from photomicrographs such as shown in FIGS. 5B and 6B, when compared to other repair methods which involve localized heating. When using localized heating, the repaired material typically has a high degree of topography.

It will be understood by those having skill in the art that the present invention can be used to deposit any repair material. Dielectrics can be deposited in areas where a defect in the passivation would result in an interlevel short. Multilayer films including adhesion layers and/or diffusion barriers can be deposited.

In order to laser deposit a given material, in prior art repair processes, there must be a source available. The maintenance and interchanging of sources may be expensive and the laser itself may be expensive. In contrast, according to the present invention, repairs can be performed on the individual substrates, but the deposition and lift-off processing (Blocks 16, 17, 26 and 27) may be performed in batch mode. This reduces waste associated with individual substrate repair, and increases throughput.

Finally, because of the manner in which the lift-off stencil is formed according to the present invention, the minimum line size that can be fabricated is not limited by the beam size of the direct write tool, but rather by the stepping ability of the tool. Direct write tools presently have a 10–100 nm resolution. Therefore, lines that are submicron in size can be produced with a tool that may only have a 2 μm exposure beam. Thus, although conventional exposure techniques are diffraction limited, the present invention reduces these diffraction effects so that a wide range of exposure sources may be used to repair a substrate.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of repairing a defective area on a microelectronic substrate, comprising the steps of:

identifying the defective area on the microelectronic substrate;

applying an image reversal photoresist on said microelectronic substrate;

exposing said image reversal photoresist for image reversal;

removing said image reversal photoresist from over said defective area;

blanket depositing a material on said image reversal photoresist and on said defective area; and removing said image reversal photoresist and the material thereon, such that said material on said defective area remains.

2. The method of claim 1 wherein said exposing step comprises the step of twice exposing said image reversal photoresist.

3. The method of claim 2 wherein the following step is performed between the two exposures of said image reversal photoresist:

reversing the tone of said image reversal photoresist.

4. The method of claim 2 wherein said twice exposing step comprises the steps of:

exposing a frame in said image reversal photoresist which surrounds said defective area; and exposing a window in said image reversal photoresist which overlies said defective area and overlaps, but does not extend beyond, said frame.

5. The method of claim 1 wherein said defective area is a missing line in a plurality of lines on said microelectronic substrate.

6. The method of claim 5 wherein said exposing step comprises the steps of:

exposing said image reversal photoresist except portions thereof which overlie said plurality of lines; and exposing a window in said image reversal photoresist which overlies, but does not extend beyond, said missing line.

7. The method of claim 6 wherein said plurality of lines are formed on said microelectronic substrate using a mask, and wherein said step of exposing said image reversal photoresist except portions thereof which overlie said plurality of lines comprises the step of exposing said image reversal photoresist using said mask.

8. The method of claim 1 wherein said defective area is a missing portion of one of a plurality of lines on said microelectronic substrate.

9. The method of claim 8 wherein said exposing step comprises the steps of:

exposing a frame in said image reversal photoresist which surrounds said missing portion; and exposing a window in said image reversal photoresist which overlies, but does not extend beyond, said missing portion and overlaps said frame.

10. The method of claim 1 wherein said defective area is a defective dielectric area on said microelectronic substrate.

11. The method of claim 1 wherein said image reversal photoresist includes an organic carboxylic acid, and wherein said exposing step comprises the steps of:

performing a first exposure of said image reversal photoresist;

diffusing an amine vapor through the first exposed image reversal photoresist to thereby reverse the tone of said image reversal photoresist; and performing a second exposure of the amine diffused image reversal photoresist.

12. The method of claim 1 wherein said step of removing said image reversal photoresist from over said defective area comprises the step of removing said image reversal photoresist from over said defective area such that the remaining photoresist produces a wall around the defective area, with the wall making an acute angle with the defective area.

13. A method of repairing a missing line in a plurality of lines on a microelectronic substrate, comprising the steps of:

identifying the missing line on the microelectronic substrate;

applying an image reversal photoresist on said microelectronic substrate;

exposing said image reversal photoresist except portions thereof which overlie said plurality of lines including said missing line;

reversing the tone of said image reversal photoresist;

exposing a window in the reversed tone photoresist, which overlies said missing line;

developing said image reversal photoresist to remove said image reversal photoresist from over said missing line;

blanket depositing a material on said image reversal photoresist and on said missing line; and removing said image reversal photoresist and the material thereon, such that said material on said missing line remains.

14. The method of claim 13 wherein said plurality of lines are formed on said microelectronic substrate using a mask, and wherein said step of exposing said image reversal photoresist excluding portions thereof which overlie said plurality of lines comprises the step of exposing said image reversal photoresist using said mask.

15. The method of claim 13 wherein said missing line is one of a missing conductive line and a missing dielectric line on said microelectronic substrate.

16. The method of claim 13 wherein said image reversal photoresist includes an organic carboxylic acid, and wherein said tone reversing step comprises the step of:

diffusing an amine vapor into the image reversal photoresist.

17. The method of claim 13 wherein said step of developing said image reversal photoresist comprises the step of developing said image reversal photoresist such that the remaining photoresist produces a wall around the missing line, with the wall making an acute angle with the missing line.

18. A method of repairing a missing portion of a microelectronic substrate, comprising the steps of:

identifying the missing portion of the microelectronic substrate;

applying an image reversal photoresist on said microelectronic substrate;

exposing a frame in said image reversal photoresist, which frame surrounds said missing portion;

reversing the tone of said image reversal photoresist;

exposing a window in said image reversal photoresist, which overlies said missing portion and overlaps said frame;

developing said image reversal photoresist to remove said image reversal photoresist from over said missing portion;

blanket depositing a material on said image reversal photoresist and on said missing line; and removing said image reversal photoresist and the material thereon, such that said material on said missing portion remains.

19. The method of claim 18 wherein said missing portion is one of a missing conductive portion and a missing dielectric portion on said microelectronic substrate.

20. The method of claim 19 wherein said image reversal photoresist includes an organic carboxylic acid, and wherein the tone reversing step comprises the step of:

diffusing an amine vapor into the image reversal photoresist.

21. The method of claim 19 wherein said step of developing said image reversal photoresist comprises the step of developing said image reversal photoresist such that the remaining photoresist produces a wall around the missing portion, with the wall making an acute angle with the missing portion.

\* \* \* \* \*